(12) United States Patent
Day

(10) Patent No.: US 8,102,207 B2
(45) Date of Patent: Jan. 24, 2012

(54) APPARATUS AND METHOD FOR BROADBAND AMPLIFIER LINEARIZATION

(75) Inventor: Chris J. Day, Santa Rosa, CA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 12/580,889

(22) Filed: Oct. 16, 2009

(65) Prior Publication Data

US 2010/0141339 A1 Jun. 10, 2010

Related U.S. Application Data

(60) Provisional application No. 61/106,455, filed on Oct. 17, 2008.

(51) Int. Cl.
*H03F 3/26* (2006.01)
(52) U.S. Cl. ........................ 330/149; 330/188
(58) Field of Classification Search .................. 330/149, 330/188; 455/114.3
See application file for complete search history.

(56) References Cited

U.S. PATENT DOCUMENTS

| | | | |
|---|---|---|---|
| 4,028,628 A * | 6/1977 | Rao et al. | 455/249.1 |
| 5,172,068 A | 12/1992 | Childs | |
| 5,282,072 A | 1/1994 | Nazarathy et al. | |
| 5,436,749 A | 7/1995 | Pidgeon et al. | |
| 5,589,797 A | 12/1996 | Gans et al. | |
| 5,798,854 A | 8/1998 | Blauvelt et al. | |
| 6,107,877 A | 8/2000 | Miguelz et al. | |
| 6,288,814 B1 | 9/2001 | Blauvelt | |
| 6,580,319 B1 | 6/2003 | Cummings et al. | |
| 7,061,317 B2 | 6/2006 | Petrovic et al. | |

OTHER PUBLICATIONS

International Search Report.

* cited by examiner

*Primary Examiner* — Steven J Mottola
(74) *Attorney, Agent, or Firm* — Schwabe Williamson & Wyatt

(57) ABSTRACT

An apparatus and method to improve broadband amplifier linearization. The present circuits make use of pre-distortion techniques to improve the $3^{rd}$ order distortion of an amplifier to reduce the amount of DC power required to achieve a given system requirement. In addition, the amplifiers have broadband characteristics which lend themselves to simplified pre-distortion. A pre-distortion linearizer circuit is connected across the input terminals of an amplifier. The linearizer circuit includes multiple diodes to improve the clipping performance of the linearizer. In addition, RC circuits align the phase of the linearizer distortion to be opposite that of the amplifier.

23 Claims, 11 Drawing Sheets

Series Linearizer

Shunt Linearizer

APPARATUS AND METHOD FOR BROADBAND AMPLIFIER LINEARIZATION

This application claims priority to U.S. Provisional Patent Application Ser. No. 61/106,455, entitled BROADBAND AMPLIFIER LINEARIZATION, filed Oct. 17, 2008, the disclosure of which is herein incorporated.

BACKGROUND OF THE INVENTION

1. Field of the Invention

The present invention relates generally to electrical circuits, and more particularly, to circuits and techniques for broadband amplifier linearization.

2. Description of the Related Art

Efficient transmission of broadband information such as analog CATV and digital QAM (quadrature amplitude modulation) signals requires linear amplification of content throughout networks. Linear amplifiers are those which add low amounts of distortion as they increase the amplitude of a signal. Amplifiers which add excessive distortion cause degradation of picture quality and reduced BER (bit error rate). Maintaining good distortion performance throughout the system requires careful attention to the design of amplifiers along the transmission chain.

Amplifiers in CATV systems generate two primary types of distortion; $2^{nd}$ order and $3^{rd}$ order. Each type of distortion leads to unique system impairments that limit the effective amount of content or information that can be transmitted through the system. For example, $3^{rd}$ order distortion in an amplifier causes QAM signals to develop spectral content which can impair the BER on the adjacent QAM channel. This spectral re-growth is a primary concern in amplifiers for digital RF networks.

Second order distortion impacts a CATV system is a number of ways, such as analog video picture quality. Increasingly, in new CATV architectures, however, the presence of $2^{nd}$ order distortion is a concern when both analog channels and QAM content are transmitted at the same time through an amplifier. Usually the QAM content is located in the upper frequency band of the system and the analog channels are left in the lower band. Second order distortion mechanisms occurring in the upper band will generate difference products that fall back into the lower frequency analog band. Since the original QAM content in the upper frequency is un-correlated to the analog content and therefore noise-like, the $2^{nd}$ order distortion will manifest as an increase in the noise floor of the analog signal, thereby degrading picture quality.

The issue is heightened by the fact that newer CATV architectures strive to reduce the number of system amplifiers by outputting higher levels of RF signal with higher levels of tilt. Tilt is the difference between the signal level at the highest channel compared to that at the lowest channel. The higher output levels and increased tilt means the RF power located in the QAM band is higher in new systems and the level in the analog band is lower. This further exasperates the $2^{nd}$ order distortion issue and leads to significant design challenges in the design of CATV amplifiers. Increasing care must be taken to insure that $2^{nd}$ order distortion products do not limit CATV systems. In particular, high QAM levels must not be allowed to cause lower analog channels to have carrier-to-noise (CNR) issues. Considering the newer QAM content and higher RF outputs, it's apparent many of the prior art linearization techniques did not did not address this issue with sufficient care.

There are a few common approaches to controlling and reducing the distortion in amplifiers. The simplest technique is to increase the size of the transistors used in the amplifiers themselves. While this readily drops the distortion, it also leads to higher power consumption since the larger transistors require more power to operate. Another technique is to use newer transistor technologies which at the device level are inherently more linear. Recently much work has been done to improve the internal distortion of transistors. Often these newer transistor technologies pose significant reliability risks as they reach technical maturity.

A prior art approach to pre-distortion are shown in FIG. 1. Here an amplifier with distortion needing to be reduced is driven from a pre-distortion circuit. For linearization to occur, the distortion created by the pre-distortion circuit needs to be the same level and opposite phase as the distortion occurring in the amplifier. In other words, the distortion from the linearizer, if it were amplified by a distortion-free amplifier, would need to have the same magnitude but opposite phase as the distortion occurring from the real amplifier itself when operated at the same output levels. Hence, operation of the circuit in FIG. 1 can be thought of as a destructive interference circuit, where the goal is to achieve good alignment of both the magnitude and phases of the two distortion signals so there is as much cancellation as possible.

One important goal of amplifier design is to achieve good bandwidth with devices which themselves often have significant terminal capacitances and charge storage effects, hereafter called capacitances, which slow down the movement of charge in the circuit and restrict bandwidth. It is also critical to point out that these device capacitances are themselves non-linear functions of the terminal voltages and currents. For low frequencies these effects have minimal influence on amplifier distortion. However, at higher frequencies, these capacitances can dominate amplifier distortion.

The design of the amplifier in FIG. 1 is usually performed with a few familiar topologies, as shown in FIG. 2. Differential versions of these topologies are also commonly used. The common-emitter topology is known to have good efficiency and noise performance, and is easy to design. However, it tends to have poor performance because device capacitances can dominate the frequency response and high frequency distortion.

The Cascode topology helps alleviate the input to output capacitance, commonly known as the collector-base or "Miller" capacitance by placing a $2^{nd}$ transistor above the main transistor. The Cascode or top device's emitter provides low impedance to the bottom device, which prevents build up of voltage and minimizes the necessary energy to charge and discharge the collector-base capacitance. The Cascode is by far the dominant topology used in infrastructure CATV amplifiers today. Even still, the Cascode amplifiers used with older silicon technology still have significant degradation in their distortion performance as frequency increases.

The Darlington topology shown in FIG. 2 also has increased bandwidth. The $1^{st}$ device acts as a buffer stage that has unity gain up to the input base of the $2^{nd}$ device. The buffer is a drive device which is able to move charge in and out of the $2^{nd}$ devices' capacitances. Consequently, the Darlington topology can have very good bandwidth. Note the Darlington shown in FIG. 2 still suffers from the Miller effect and likewise has significant degradation in distortion performance at higher frequencies.

All amplifier topologies in FIG. 2 will have some degradation in distortion performance as frequency is increased. The drop off in distortion performance of the amplifier with increasing frequency indicates that the magnitude of the amplifier's distortion is increasing. It also suggests that the phase of the distortion is also not constant with frequency.

This change in magnitude and phase of the distortion signal as frequency is increased makes the design of the linearizer much more difficult.

Normally during the design of the amplifiers shown in FIG. 2 the type of frequency response of the distortion products is of little concern. For broadband amplifiers, the design goal is usually to have an amplifier whose composite distortions be minimized. In the field of CATV amplifiers, relevant distortions are composite second order (CSO) and composite triple beat (CTB). Normally the design goal for a CATV amplifier would be for the CSO and CTB to be lower than some specified value. There is usually little concern given with regard to which frequencies the CSO and CTB are lowest.

A common shunt-type linearizer circuit is shown in FIG. 3a. Here, two weakly forward biased diodes, D1 and D2, are placed in anti-series and across the input signal line. The capacitors C1, C2, and C3 are all large bypass capacitors. R1, R2, and IBIAS are used to set the bias condition in the diodes. In normal operation D1 and D2 are weakly biased at a very small current. FIG. 4 shows the IV characteristics of the forward biased diode. For common diodes the relationship between terminal voltage and current is given by an exponential relationship. This exponential may be differentiated to give the effective video resistance, or small signal resistance, of the diode at the specific IBIAS. Note that if the amount of forward bias current is increased from IBIAS, the video resistance dynamically decreases, and that if the current is likewise decreased the video resistance is dynamically increased. Thus, when an incident signal is applied to the diode having a bias current of IBIAS the diode acts as a resistor whose resistance varies with the incident signal. Considering the circuit of FIG. 3A again, an RF signal on the input will both increase and decrease the node voltage at point A in the circuit. When the voltage at node A increases, the currents in D1 and D2 both change. The forward bias current in D1 increases, which causes its video resistance to decrease. However, the forward bias current in D2 decreases, which causes its video resistance to increase. Because of the exponential behavior of the diode, the increase in D2's video resistance is greater than the decrease in D1's video resistance, which means the overall video resistance of D1 and D2 in series increases as the RF voltage at point A increases. This means the loss in the linearizer circuit decreases as the RF voltage increases. This is commonly known as "gain" expansion.

There are many pre-distortion circuits but their operation is similar to FIG. 3. A diode's exponential characteristics are used to make a circuit which has less loss when the input signal level is high. This characteristic is almost always what is needed because most amplifiers have the opposite gain compressive behavior as the RF input is increased.

A series-type linearizer is shown in FIG. 3B and is used in numerous patents in the CATV industry, such as U.S. Pat. No. 6,107,877 (Miguelez, et al) and U.S. Pat. No. 6,580,319 (Cummings, et al). Miguelez and Cummings both apply series-type pre-distortion to the familiar CATV hybrid amplifier, which is thought of as the workhorse amplifier component in CATV distribution networks. Operation is similar to the earlier described shunt-type, where an increase of the incident RF signal leads to a decrease in the amount of loss. In this case, an increase in RF signal leads to a drop in the dynamic diode resistance; in the series path a drop in resistance leads to an increase of gain.

The circuits in FIGS. 3A and 3B are commonly used to pre-distort amplifiers. Alignment of its distortion to that of the amplifier is often done by adjusting the value of IBIAS. Higher values of IBIAS will lead to less distortion from the linearizer circuit. Note the circuits in FIGS. 3A and 3B allow for only the adjustment of the magnitude of the distortion term, with no ability to control the phase. As noted, most amplifiers' distortion products have varying phase response over frequency, so the circuits in FIGS. 3A and 3B are incomplete.

Often designers place phase compensation circuits to align the phases for best cancellation. Miguelez and Cummings disclose techniques for adjusting the phase of the pre-distortion signals for cancellation with the amplifier's distortion. Small capacitance or inductance may be used to perform the alignment. However, the circuits disclosed in Miguelez and Cummings are not easily implemented in an integrated circuit because they require capacitors of large value to achieve the low frequency response needed. The added capacitors will tend to reduce the possible benefits of integration due to their added parasitic length to the circuit. In short, the series-type linearizers of Miguelez and Cummings do not lend themselves to integration.

A similar statement may be made about U.S. Pat. No. 5,798,854 and U.S. Pat. No. 6,288,814, (both Blauvelt), where a real and imaginary alignment of distortion terms with respect to electronic or optical elements is disclosed. The techniques disclosed in Blauvelt require either large blocking capacitors or biasing inductors to route biasing signals around or to diodes or FETs.

Techniques commonly used to pre-distort optical transmitters often make use of broadband splitters or couplers to divide signals in specific ratios. They also rely on delay lines to help align the phases between pre-distorters and amplifiers or optical transmitter. A few prior art references that illustrate this are U.S. Pat. No. 5,589,797 (Gans, et al) and U.S. Pat. No. 5,436,749 (Pidgeon, et al), which both utilize delay lines and are hence not suitable for integrated circuit implementation.

U.S. Pat. No. 5,282,072 (Nazarathy, et al) discloses a shunt-type linearizer for optical transmitters which may be extended to work with amplifiers. However, the circuitry disclosed in Nazarathy is not well designed with respect to their suitability in an integrated circuit process with uncertain matching characteristics. Any imbalance in the diode characteristics will lead to imbalance of currents in the diode branches and potentially large $2^{nd}$ order distortion. The potential for large $2^{nd}$ order distortion makes Nazarathy of questionable value for integrated designs. Furthermore, Nazarathy does not disclose the critical step of aligning the phase responses between the pre-distortion generator and amplifier, which as earlier noted can require large delay lines and greatly complicate the task of integration. Modifications on Nazarathy require the aforementioned large blocking capacitors or bias inductors, which are likewise not given to integration.

One problem with the pre-distortion circuit in FIG. 3A is the premature clipping of the linearizer before the amplifier compresses completely. In other words, distortion characteristics from common linearizers, such as that in FIG. 3A, vary considerably as the input RF level is increased, and high amounts of RF drive can cause the linearizer to clip prematurely before the amplifier does. This leads to very undesirable degradation of combined compression performance. Hence, it becomes very important to design pre-distortion circuits that have the necessary distortion characteristics to insure good cancellation with the amplifier, but which do not prematurely clip as the input drive is increased. Very often in prior art linearizers the pre-distortion circuit adversely affects the high power performance of the combined response.

Finally, U.S. Pat. No. 5,172,068 (Childs) discloses how multiple series diodes in an anti-series configuration may be used as a pre-distortion circuit for $3^{rd}$ order products. Childs discloses that multiple series diodes makes it possible that a larger RF signal may be sent through the circuit. Childs does not show a method for adjusting the phase response of the distortion terms, only how their variation over frequency may be minimized. Instead, Childs discloses that a higher RF level can be useful in maintaining good high frequency distortion cancellation characteristics. Childs otherwise does not show how the phase alignment between the pre-distortion circuit and the element being linearized may be adjusted other than by adjusting the number of diodes and the input RF level.

SUMMARY OF THE INVENTION

In general, the present invention is an apparatus and method to improve broadband linearization. The present invention makes use of pre-distortion techniques to improve the $3^{rd}$ order distortion of an amplifier to reduce the amount of DC power required to achieve a given system requirement. In addition, the amplifiers have broadband characteristics which lend themselves to simplified pre-distortion.

More particularly, according to one embodiment of the present invention a circuit comprises an amplifier circuit having two inputs, and a pre-distortion linearizer circuit connected across the two input of the amplifier circuit. The linearizer circuit comprises an input transformer, and a linearizing diode network connected across an output of the input transformer, wherein the diode networks comprises more than two diodes. In a preferred embodiment the linearizing diode network comprises six diodes.

In one embodiment, the input transformer is biased with a VBIAS voltage to push current through the linearizing diode network. In an alternative embodiment, a first current source and a second current source bias the linearizing diode network. The first and second current sources can be skewed to introduces $2^{nd}$ order distortion into the circuit.

The circuit may further comprise a first resistor and a first capacitor connected in parallel and connected to a first section of the linearizing diode network, and a second resistor and a second capacitor connected in parallel and connected to a second section of the linearizing diode network, wherein the first resistor and first capacitor and second resistor and second capacitor align the phase of the linearizer distortion to be opposite that of the amplifier The amplifier may be a differential amplifier or comprise two matched amplifiers, each having one input. The circuit may further comprise a balun connected to an output of the amplifier.

In one embodiment, the amplifier is a Modified Darlington amplifier, wherein the drains of the input stage transistors are connected together. The amplifier may comprise a cascode amplifier.

According to another embodiment of the present invention, a circuit comprises an input transformer having a first output and a second output, a VBIAS voltage connected to the input transformer, a first RC network connected to a first output of the input transformer, a first linearizing diode network connected to the first RC network, a second RC network connected to the second output of the input transformer, a second linearizing diode network connected to the second RC network, and an amplifier having a first input connected to the first output of the input transformer, and a second input connected to the second output of the input transformer.

The amplifier may be a differential amplifier or two matched amplifiers, each having one input. In a preferred embodiment, the first linearizing diode network comprises three diodes, and the second linearizing diode network comprises three diodes.

According to another embodiment, a circuit comprises an input transformer having a first output and a second output, a first RC network connected to a first output of the input transformer, a first linearizing diode network connected to the first RC network, a second RC network connected to the second output of the input transformer, a second linearizing diode network connected to the second RC network, a first current source connected to the first output of the input transformer, a second current source connected to the second output of the input transformer, and an amplifier having a first input connected to the first output of the input transformer, and a second input connected to the second output of the input transformer.

In one embodiment a circuit comprises an input transformer having a first output and a second output, a first RC network connected to a first output of the input transformer, a first linearizing diode network connected to the first RC network, a second RC network connected to the second output of the input transformer, a second linearizing diode network connected to the second RC network, a VBIAS voltage connected to the first and second linearizing diode networks, and a Modified Darlington amplifier having a first input connected to the first output of the input transformer, and a second input connected to the second output of the input transformer, wherein drains of input stage transistors in the amplifier are connected together.

One particular embodiment comprises an input transformer having a first output and a second output, a first RC network connected to a first output of the input transformer, a first linearizing diode network connected to the first RC network, a second RC network connected to the second output of the input transformer, a second linearizing diode network connected to the second RC network, a voltage connected to the first and second linearizing diode networks, a first current source connected to the first output of the input transformer, a second current source connected to the second output of the input transformer, and a differential cascode amplifier connected to the first and second outputs of the input transformer.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

The present invention discloses how improved distortion can be achieved without adding extra power to the amplifier and without requiring that newer transistor technologies be used. The invention may be advantageously applied to a new CATV amplifier integrated circuit which achieves critical system distortion requirements while reducing power consumption by more than 40% compared with the current state of the art alternatives.

More particularly, the present invention makes use of pre-distortion techniques to improve the $3^{rd}$ order distortion of a CATV amplifier to reduce the amount of DC power required to achieve a given system requirement. While pre-distortion has been successfully used for quite some time, the present invention makes use of unique circuitry which systematically overcomes common problems associated with pre-distortion linearization. As disclosed herein, $3^{rd}$ order pre-distortion can be designed while maintaining excellent $2^{nd}$ order distortion. As previously noted, control of $2^{nd}$ order products is critical when newer CATV signals and architectures are deployed.

The present technique also alleviates a common problem with linearization in that there are often complicated adjustments needed for best performance at various frequencies or power levels. The technique further minimizes this problem and provides for much simpler operation across a wide bandwidth and a large dynamic range of input levels. The later is commonly associated with QAM signals with comparatively large peak-to-average signal ratios.

The present design methodology discloses that the design of the amplifier to be linearized and the design of the pre-distortion circuit are designed each with the other in mind. Key to the success of the methodology is the design of the amplifier to have broadband characteristics which lend themselves to simplified pre-distortion. Similarly, the pre-distortion circuit proposed in the invention is done with the amplifier's characteristics in mind, using a technique not commonly used in pre-distortion circuitry. Moreover, the present techniques overcome problems with the prior art with respect to implementation into an integrated circuit. This integration is important not only for cost reduction and performance consistency, but perhaps more importantly, to minimize parasitic effects which have often limited the pre-distortion effectiveness of discrete implementations on printed circuit boards.

Figure 5B:
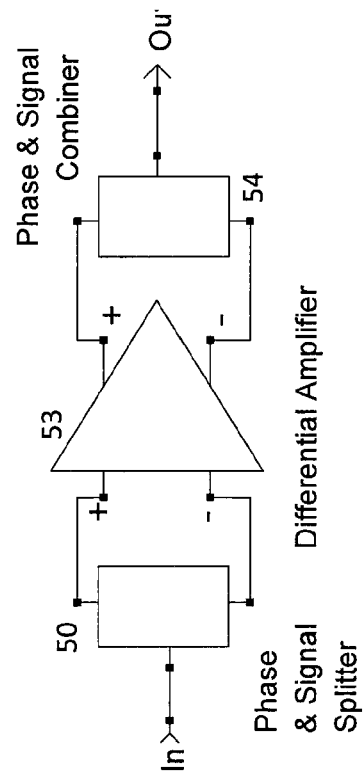
FIG. 5B is a block diagram of circuit having a differential amplifier.
Figure 5A:
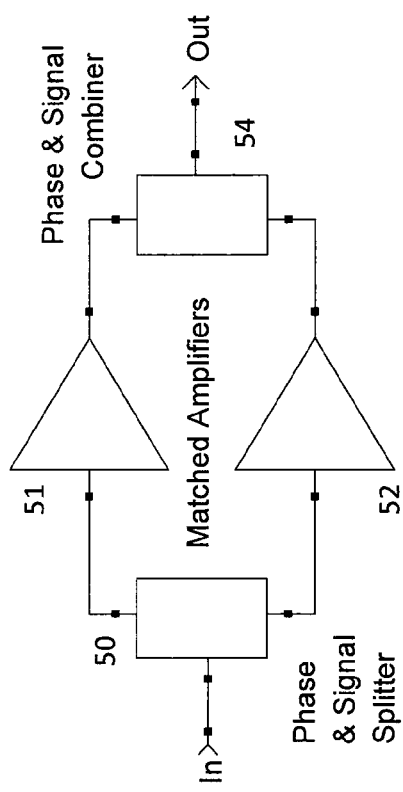
FIG. 5A is block diagram of a circuit having matched amplifiers.

In many amplifiers it is desirable to operate in a push pull mode, where two matched amplifiers are operated out of phase with each other. FIGS. 5A and 5B illustrate two arrangements. Either matched amplifiers 51, 52 may be used (FIG. 5A), or a fully differential amplifier 53 can be used (FIG. 5B). In both cases, a phase splitter device 50, such as a balun, is used to convert from an un-balanced input or output to a balanced configuration.

Figure 3B:
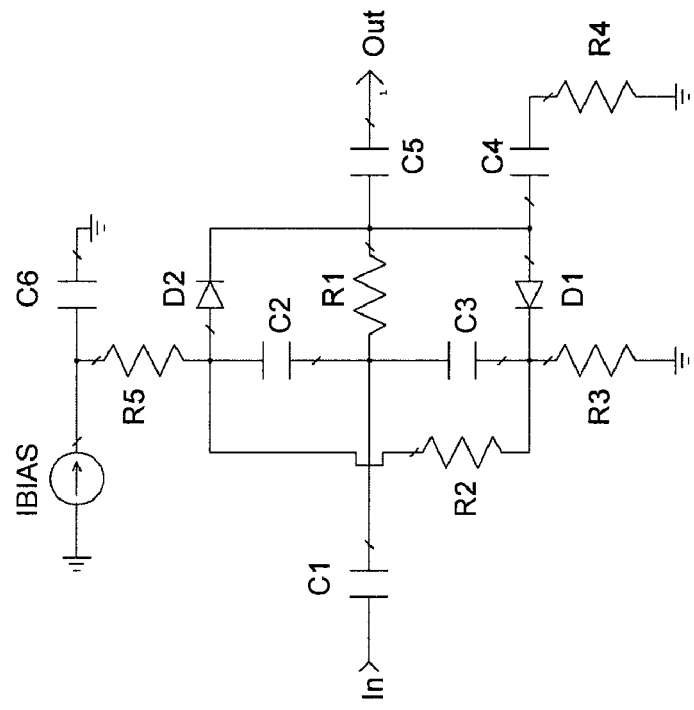
FIG. 3B is a schematic of a prior art series linearizer circuit.
Figure 3A:
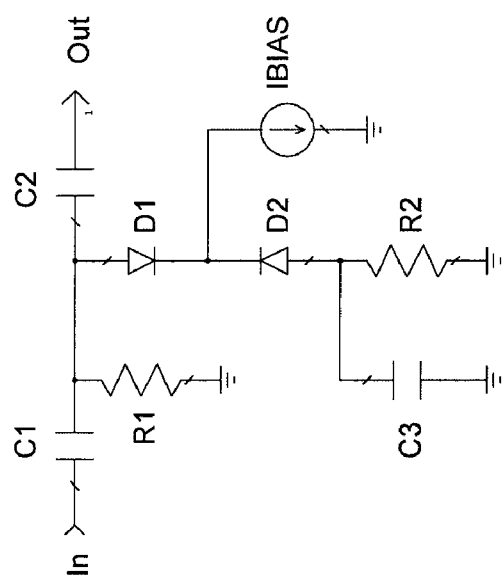
FIG. 3A is a schematic of a prior art shunt linearizer circuit.
Figure 4:
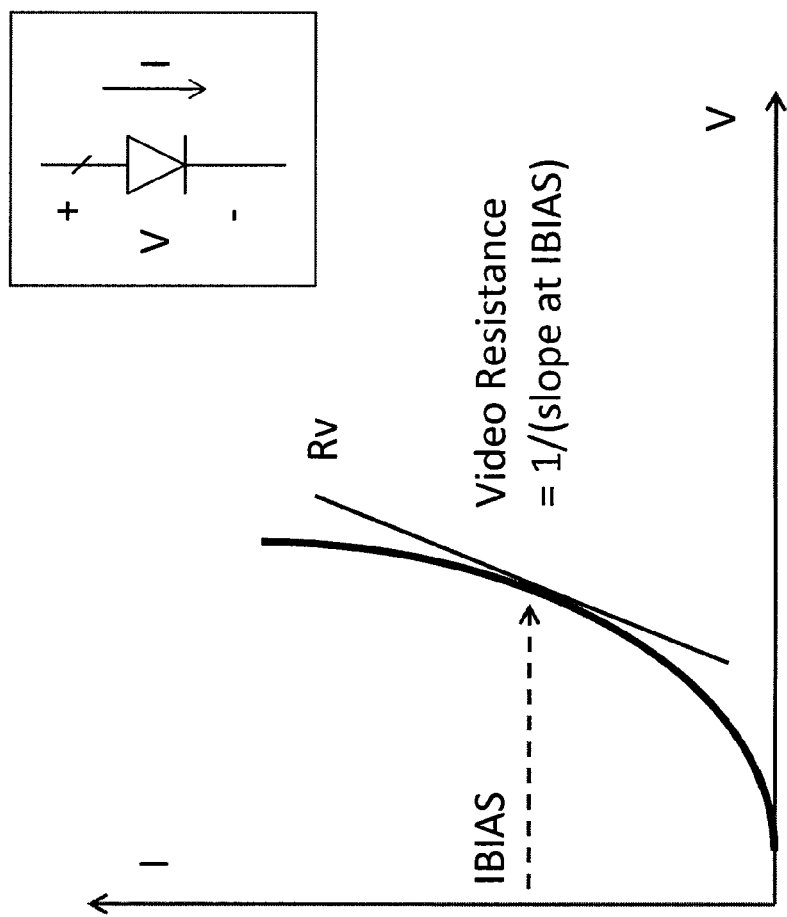
FIG. 4 is a graph the IV charateristics of a forward biased diode in the circuit of FIG. 3A.
Figure 6:
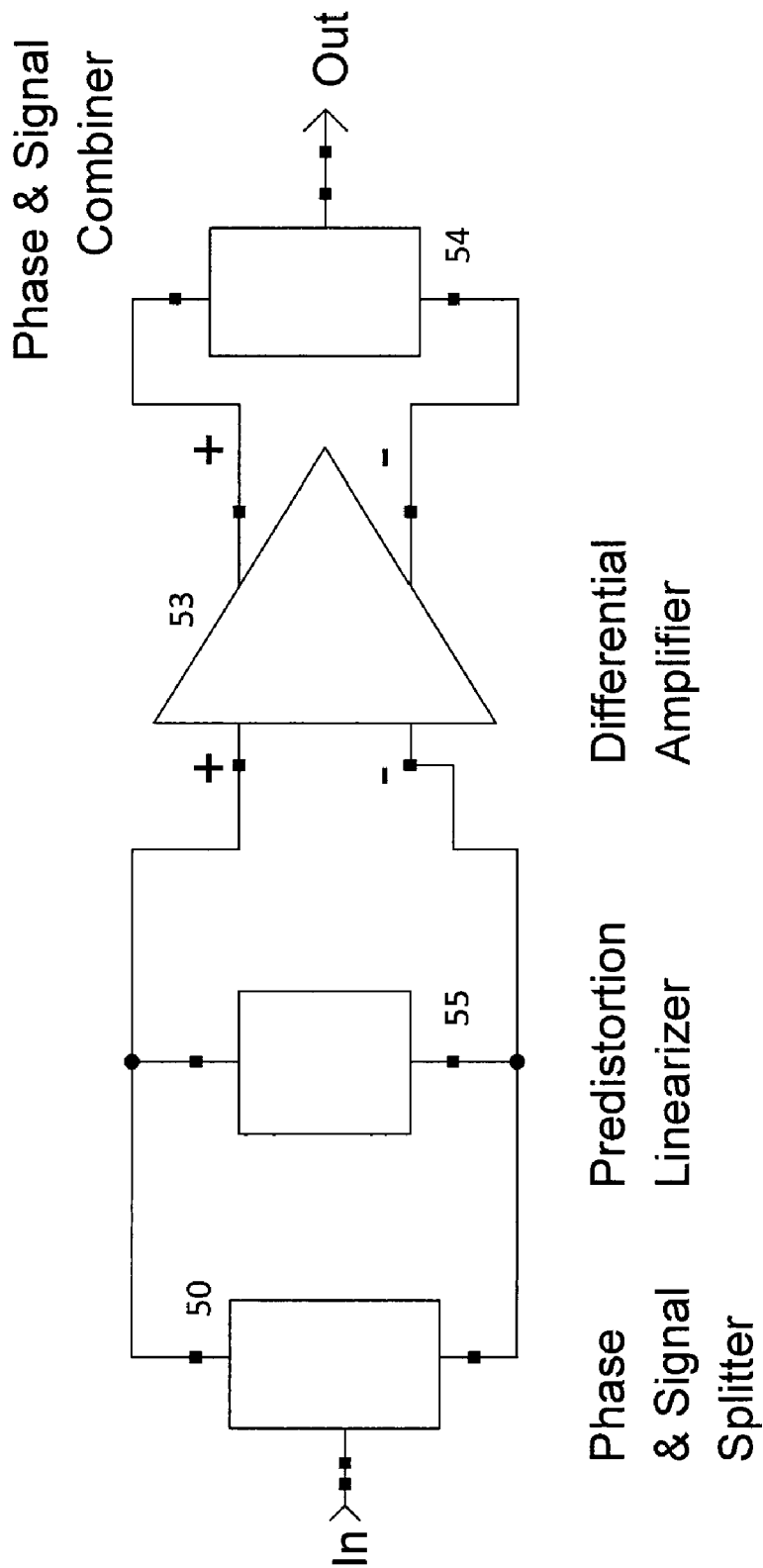
FIG. 6 is a block diagram of a circuit having a pre-distortion linearizer connected across the inputs of a differential amplifier, according to an embodiment of the present invention.

FIG. 6 illustrates a fully differential implementation where the linearization is placed across the balanced input terminals after the phase splitter. Specifically, the input is applied to a phase splitter 50, and a linearizer 55 is connected across the input terminals of the differential amplifier 53. The linearizer 55 operates in a similar manner as the circuit of FIG. 3, except that the circuit is differential and there is no inherent ground reference. The circuit in FIG. 6 is advantageous because it lends itself nicely to accomplishing the biasing of linearizing diodes by using the DC path of an input transformer or by using the DC connection of a commonly used feedback resistor.

Figure 7:
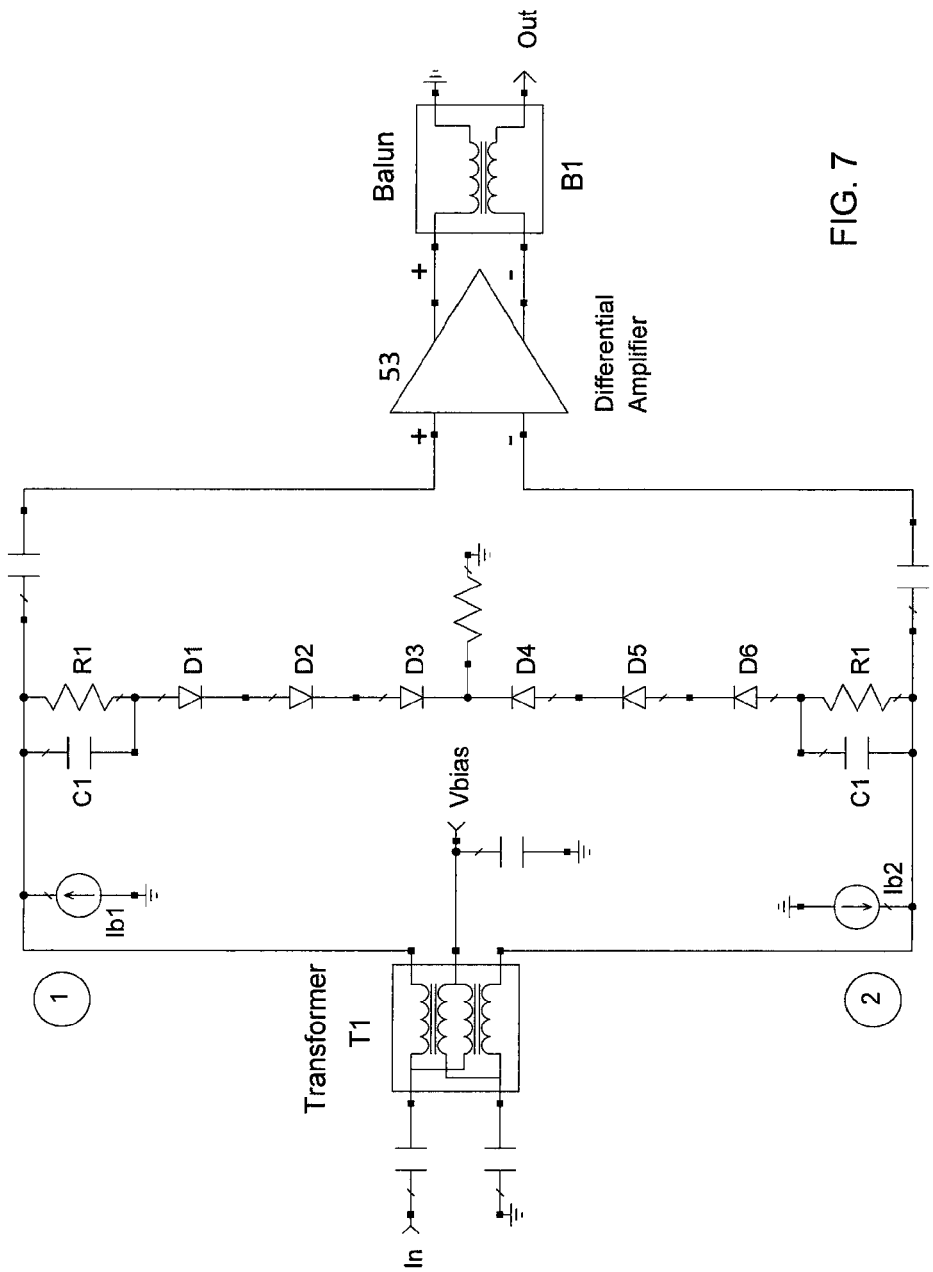
FIG. 7 is a circuit schematic of an embodiment of the present invention.

FIG. 7 illustrates how an input transformer may be used to bias linearizing diodes. A commonly available 4:1 impedance transformer T1 may be used to introduce a bias voltage VBIAS to push current through the linearizing diodes D1-D6. The diodes D1-D6 operate as a linearizer in a manner previously explained. The transformer T1 also serves to split the signal and phase before the differential amplifier 53. An output balun B1 serves to combine the outputs of the amplifier 53. FIG. 7 illustrates an input transformer T1 implemented as a transmission line type; it is equally valid to perform this function with a flux-coupled transformer where the impedance ratio can be set by the ratio of turns.

Alternatively, diode bias current for the circuit in FIG. 7 may be sourced from current sources, Ib1 and Ib2 respectively, which push current into nodes (1) and (2). To adjust for imbalance commonly observed in amplitude and phase splitting transformers or baluns, the bias current Ib1 and Ib2 may be intentionally skewed. This intentionally introduces $2^{nd}$ order distortion into the circuit and can be useful in nulling any residual $2^{nd}$ order from the amplifier itself. Such residual $2^{nd}$ order distortion may be caused by poor transformer or balun performance or by slight imbalance in the differential amplifier 53 itself.

Note that by using current sources to bias the diodes D1-D6, potential variations in D1-D6 characteristics due to manufacturing variances are minimized. The circuit conveniently allows for current sources to be used for this purpose.

To align the phase of the linearizer distortion to be opposite that of the differential amplifier, an RC pole formed by R1 and C1 is used. At higher frequencies, the capacitor C1 dominates the parallel combination and more RF is allowed to appear across the diode string. Hence, at higher frequencies the linearizer becomes more non-linear, which as noted matches the normal behavior of most amplifiers.

The number of diodes in the linearizer is very important. While it is common to use a pair of diodes, it can be shown that addition of multiple diodes can improve the clipping performance of the linearizer. The use of multiple diodes in the linearizer helps to increase the power level at which the linearizer compresses. While adding diodes does change their distortion generating properties, the correct amount of distortion necessary for good cancellation at moderate RF power levels can be achieved by simply adjusting the amount of IBIAS current nominally operating in each diode. In this case, the multiple diode approach will achieve better cancellation over a wider power range and will mitigate the possibility of the linearizer clipping before the amplifier. In this example, the use of multiple diodes is naturally available in an RFIC process. In a discrete implementation on a printed circuit board, multiple diodes could lead to excessive parasitic which could alter the phase relationship between the linearizer and the amplifier.

Figure 8:
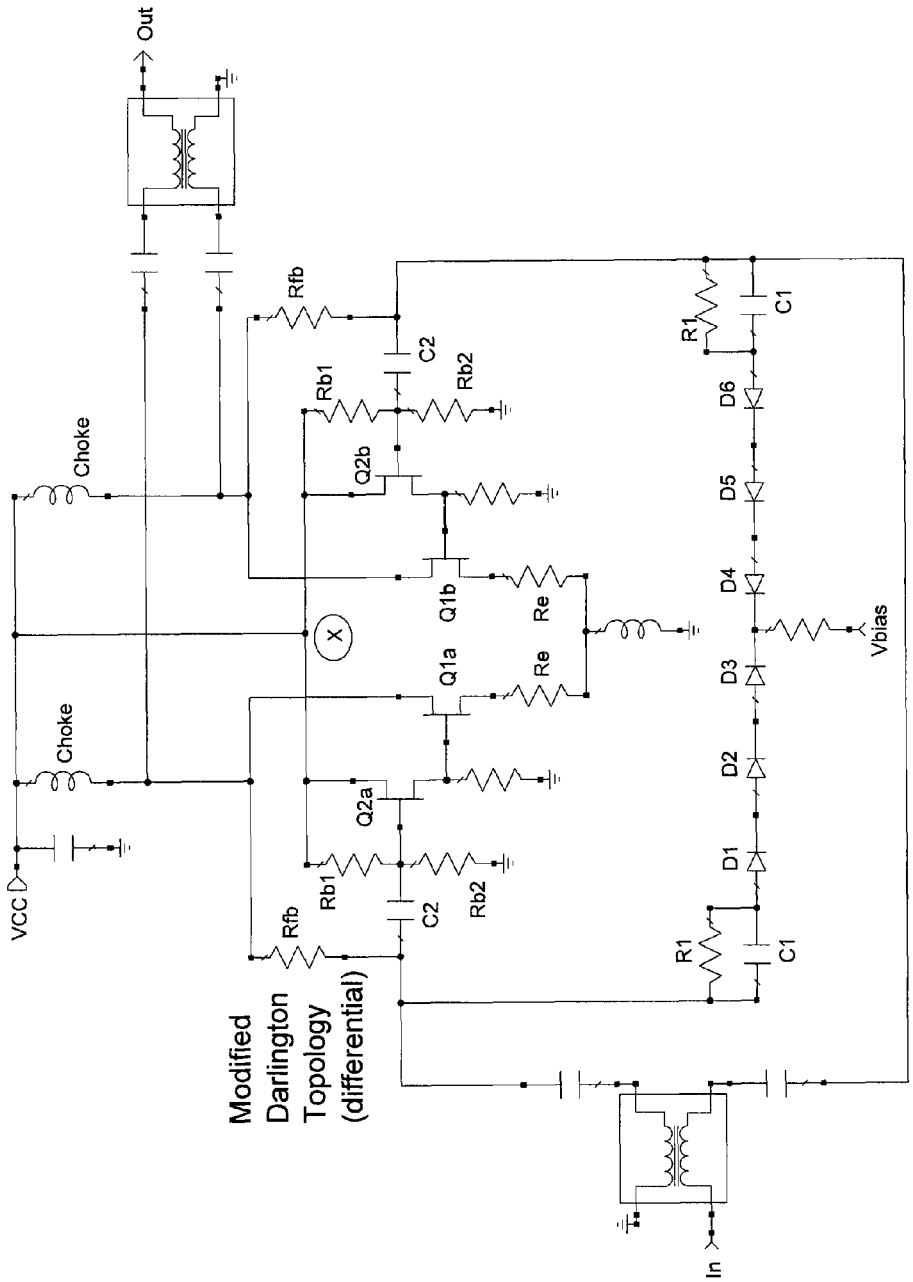
FIG. 8 is a more detailed circuit schematic of an embodiment of the present invention.

A more detailed embodiment of the present invention is shown in FIG. 8 where linearizer diode bias is introduced through the feedback resistors RFB. Diodes D1-D6 are easily integrated on a single chip; bias control of the linearizing diodes is performed with a single off-chip adjustment denoted VBIAS. The advantage of this approach is full integration can be easily achieved of the amplifier with the linearizer, which minimizes the chance that parasitic effects influence the phase relationship between the two distortion terms. The capacitors C2 are on-chip small blocking type whose value need not be large due to the large input impedance afforded by using FET technology. In this case Rb1 and Rb2 are large and are present for biasing purposes only and do not significantly impact the input impedance seen at the gates of Q1a and Q2b. Bias of the amplifier is performed with the large on-chip resistor RB1 and RB2, which form a voltage divider and set the gate voltage to Q2a and Q2b.

In this implementation, the amplifier is a modification on the Darlington topology previously described. Note in this case the drains of the input devices Q2a and Q2b are not connected to the drains of Q1a and Q1b respectively. By connecting the drains of the input stage together, thus forming a virtual ground at point X in FIG. 8, the Miller capacitance of the amplifier is greatly minimized because there is no voltage gain from the input gate of Q2a and Q2b to their drains.

Figure 9A:
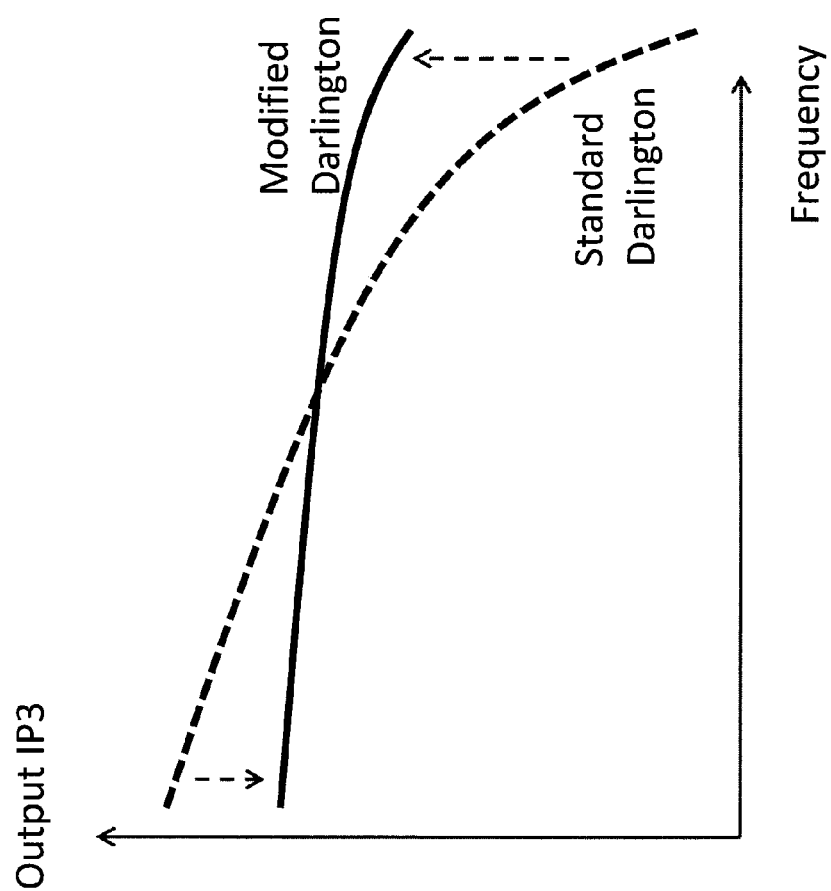
FIG. 9A is graph of IP3 versus frequency comparing a typical Darlington design and a Modified Darlington design according to the present invention.

This minimization of the Miller effects in the Darlington topology overcomes one of the main limitations of the design of amplifiers, namely, the flattening out of the distortion response over frequency. FIG. 9A is a graph that illustrates the typical output IP3 (Intercept Point $3^{rd}$ order) performance of a standard Darlington topology as well as that achieved by the Modified Darlington. The downward sloping IP3 (freq) performance of the standard Darlington indicates that a significant capacitance or reactance is affecting the phase response of amplifier distortion. The very flat IP3 performance over frequency of the Modified Darlington indicates that the phase response of its distortion is comparatively flat and well-behaved. This makes the job of designing a linearizer capable of broad bandwidth much simpler and effective since the amount of cancellation depends on the phase alignment between sources of distortion.

Figure 1:
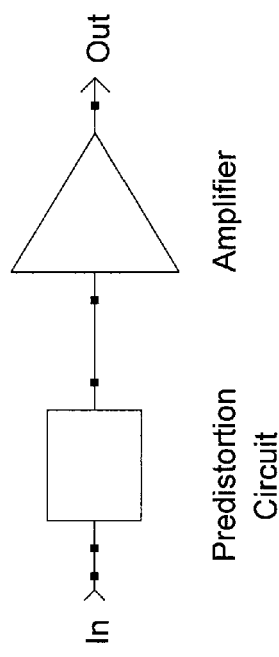
FIG. 1 is a block diagram of a prior art approach utilizing pre-distortion.
Figure 2:
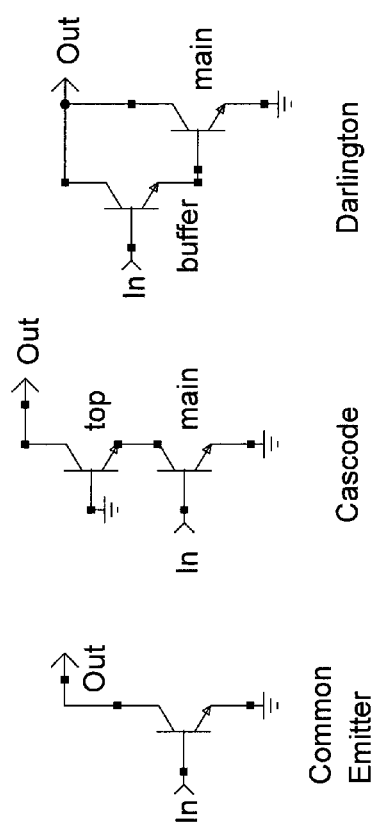
FIG. 2 illustrates schematics of prior art amplifier designs.

Note that the low frequency IP3 performance shown in FIG. 9A of the standard Darlington is superior to that of the Modified Darlington. This is because in the standard Darlington the current consumed in the input stage device, shown as the buffer stage in FIG. 2, contributes to the output drive, whereas in the Modified Darlington of FIG. 8 they do not. The power compression performance, commonly referred to a the 1 dB compression point or P1 dB, is higher in the standard Darlington than in the Modified Darlington. This loss of efficiency and P1 dB generally rules out the Modified Cascode for consideration in the majority of designs. However, according to the present invention, by coupling the design of the main amplifier with the design of the linearizer improved pre-distortion effectiveness may be achieved.

An effective method to achieve good phase alignment between the linearizer and amplifier is to minimize phase variations in the amplifier's distortion as part of the starting amplifier design. Such an objective is not known to exist or is at minimum very rare in the design of amplifiers; rather the usual goal is simply to achieve higher amounts of IP3 performance.

Figure 9B:
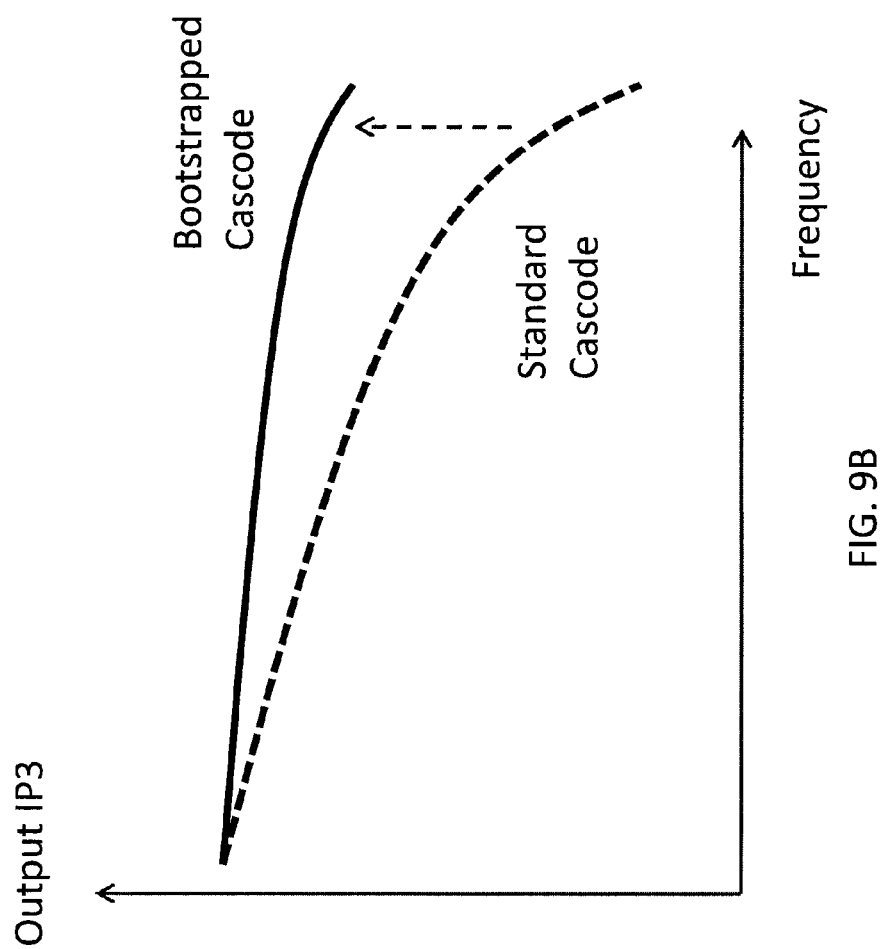
FIG. 9B is a graph of IP3 versus frequency comparing a typical Cascode design with a Bootstrapped Cascode design according to the present invention.

As another example of the design process of the current invention, FIG. 9B shows typical IP3 performance over frequency for a standard Cascode compared to a Bootstrapped Cascode shown in FIG. 11 which will be described in detail later. The IP3 performance of the Bootstrapped Cascode shown in FIG. 9B would be preferred over that of the standard Cascode. The Bootstrapped Cascode approach is often ruled out due to its high levels of instability and unwieldy behavior.

In the present invention, the design of the amplifier is done to achieve reasonable IP3, but priority is given to achieving flat IP3 over the frequencies of interest as shown in FIGS. 9A and 9B. In that way, the design of the linearizer is greatly simplified and cancellation prospects over a wider range of frequencies and powers is enhanced.

The Modified Darlington used here also has the significant advantage that its distortion behavior is dominated by a primary distortion mechanism inside the FET. The distortion occurring in the amplifier is dominated by the FET transconduction as a function of input Vgs. The input devices, Q2a and Q2b, act as simple unit gain buffers and do not contribute much distortion. Because there is a single device which dominates the distortion, it is much easier to devise a cancellation circuit to align the magnitude and phase responses. This would not be the case in a Cascode stage, where there is significant interaction between the top and bottom devices in terms of how device non-linearites manifest in the overall amplifier distortion.

In the general sense, the method disclosed herein involves careful design of the amplifier to present well behaved distortion performance over both a wide frequency range of interest as well as a wide range of input signals. Such a requirement is common in modern CATV systems, where the frequency range now extends from 50 to 1000 MHz and beyond, and the number of channels is very high and the peak to average power ratio indicates a wide range of instantaneous power will be present.

Figure 10:
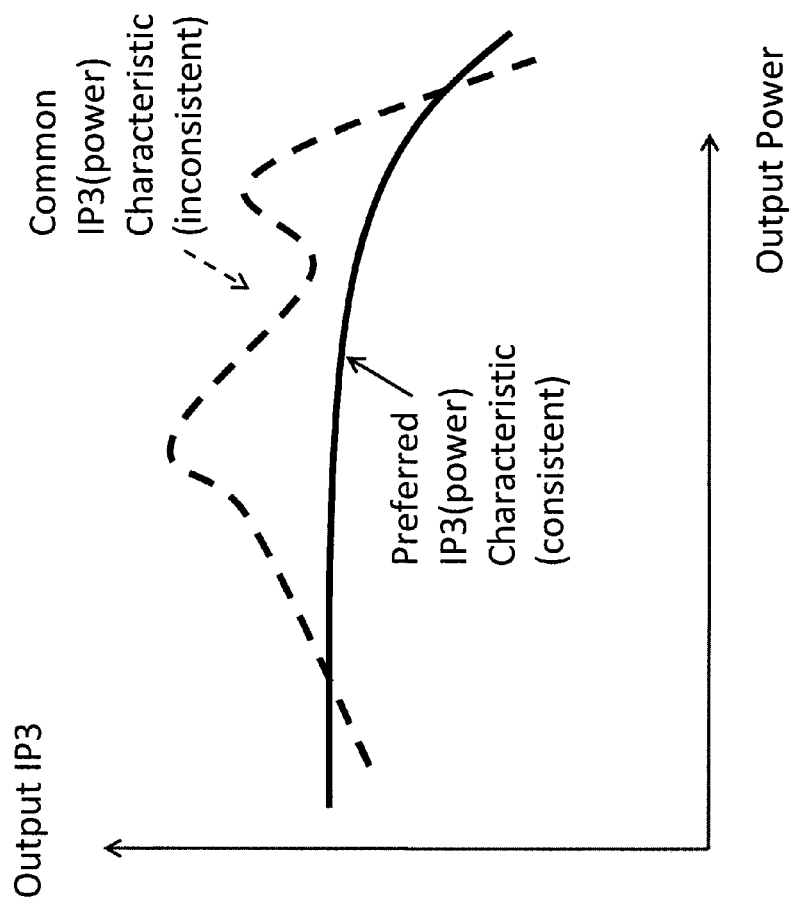
FIG. 10 is graph of plots of IP3 versus output tone power.

FIG. 10 shows how this requirement can be understood in common terminology. FIG. 10 is a graph of plots of IP3 versus output tone power. Ideally, one would like to design an amplifier to have flat IP3 (power) all the way until compression effect take over, and one would like to have the same response for each frequency. If this is achieved, prospects for high levels of cancellation over a wide range of power is good because the design of the multi-diode linearizer is eased. Often it is found that devices and normal topologies can process IP3(power) which is higher erratic as shown in FIG. 10. Commonly, such an amplifier would be preferred since its IP3 is better at higher output power levels; however such an amplifier is much harder to linearize.

The method described herein seeks to achieve a flat IP3 (power,freq), even at the counter-intuitive expense of degraded bare amplifier performance. Use of multiple diodes in an integrated fashion greatly improves the ability to align distortion terms between the linearizer and amplifier.

Figure 11:
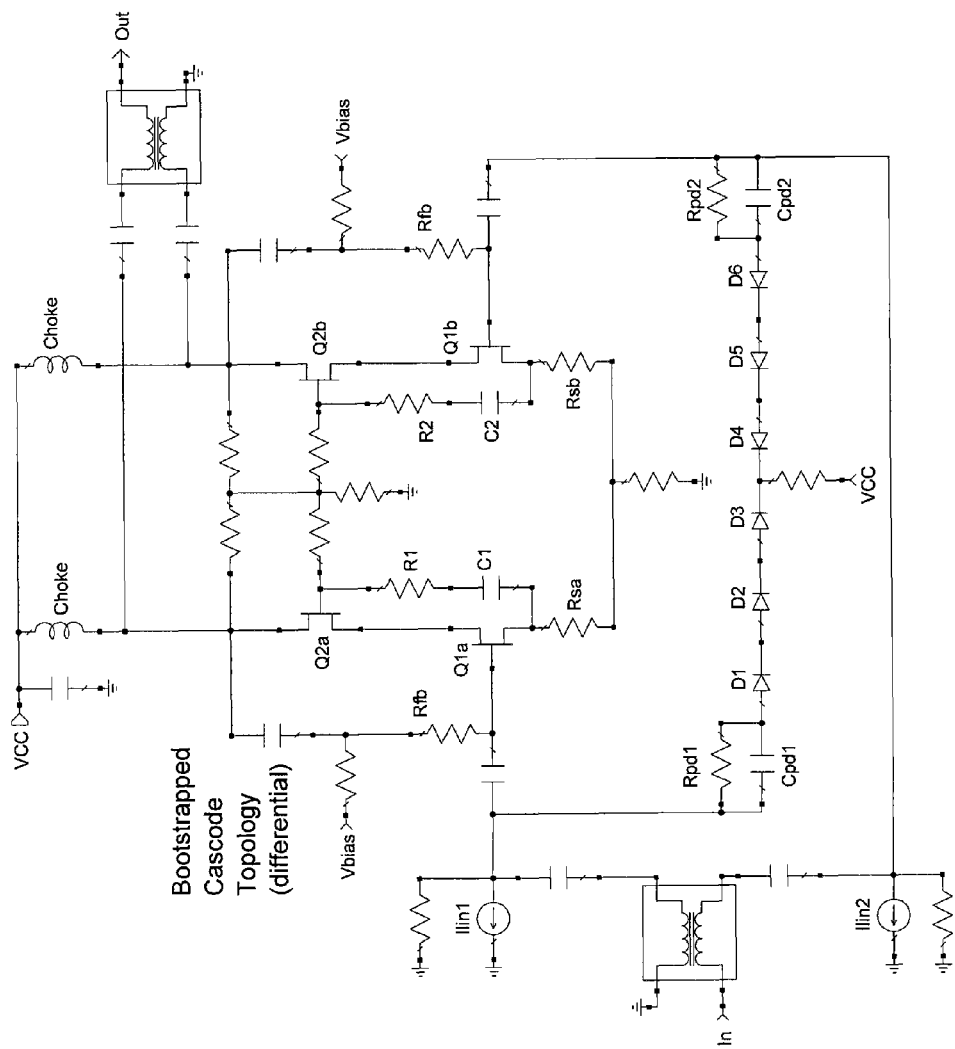
FIG. 11 is a circuit schematic of an alternative embodiment of the present invention.

A similar circuit using a Cascode topology is shown in FIG. 11. In this implementation, the bottom devices Q1a and Q1b translate the input gate voltages into currents, which are then passed along through Q2a and Q2b respectively to the outputs which are connected to the drains of Q2a and Q2b.

Source resistors Rsa and Rsb sense the current and provide a form of negative feedback. On each half, there is a bootstrapping network formed by R1 in series with C1, and C2 in series with R2. The purpose of these bootstrapping networks is to dynamically adjust the top gate voltages of Q2a and Q2b respectively such that the RF voltage swing across Q1a and Q1b is held nearly constant. If these bootstrapping networks were not used, the parasitic capacitances of the top FETs Q2a and Q2b would cause RF signal to appear across the drain-gate of Q1a and Q1b. Such a condition defeats the purpose of the cascode topology and is a primary cause of the deterioration of IP3(freq). In other words, without the bootstrapping networks in FIG. 11, the cascode topology will suffer significant roll-off in its IP3 characteristics over frequency and as such will be more difficult to pre-distortion with phase-aligned linearization circuitry. As in the case of the Modified Darlington previously discussed, the bootstrapped cascode achieves relatively flat IP3(freq) characteristics.

The linearizer in FIG. 11 is formed with diodes D1-D6. The gates of Q1a and Q1b are coupled through off-chip capacitors to parallel RC networks formed by Rpd1 with Cpd1 and Rpd2 with Cpd2 respectively. Altogether D1-D6 and Rpd1 with Cpd1 and Rpd2 with Cpd2 form the shunt linearizer. Adjustment of distortion products is performed by adjusting the bias currents in D1-D6, which may be accomplished by connecting current sources Ilin1 and Ilin2 to ground as indicated. Phase alignment of the distortion products to those of the amplifier is accomplished by adjusting the values of Cpd1 and Cpd2. If adjustment of $2^{nd}$ order distortion is needed, the current Ilin1 and Ilin2 may be intentionally skewed. For simplicity, the biasing may be performed by replacing the current sources with resistors, with the downside being that the linearizer bias currents will then be susceptible to diode process variations and resistor tolerances, either of which could lead to adverse $2^{nd}$ order performance.

Those skilled in the art will appreciate that various adaptations and modifications of the just described preferred embodiments can be configured without departing from the scope and spirit of the invention. Therefore, it is to be understood that, within the scope of the appended claims, the invention may be practiced other than as specifically described herein.

What is claimed is:

1. A circuit comprising:
an amplifier circuit having two inputs; and
a pre-distortion linearizer circuit connected across the two inputs of the amplifier circuit and having:
an input transformer; and
a linearizing diode network connected across an output of the input transformer and including six diodes.

2. A circuit comprising:
an amplifier circuit having two inputs; and
a pre-distortion linearizer circuit connected across the two inputs of the amplifier circuit and having:
an input transformer; and
a linearizing diode network connected across an output of the input transformer and including more than two diodes; and
a first current source and a second current source to bias the linearizing diode network.

3. The circuit of claim 2, wherein the input transformer is configured to be biased with a VBIAS voltage to push current through the linearizing diode network.

4. The circuit of claim 2, wherein the first and second current sources are skewed to introduce $2^{nd}$ order distortion into the circuit.

5. The circuit of claim 2, further comprising a first resistor and a first capacitor connected in parallel and connected to a first section of the linearizing diode network.

6. A circuit comprising:
an amplifier circuit having two inputs;
a pre-distortion linearizer circuit connected across the two inputs of the amplifier circuit and having:
an input transformer; and
a linearizing diode network connected across an output of the input transformer and including at least two diodes; and
a first resistor and a first capacitor connected in parallel and connected to a first section of the linearizing diode network; and
a second resistor and a second capacitor connected in parallel and connected to a second section of the linearizing diode network;
wherein the first resistor and first capacitor and second resistor and second capacitor are configured to align the phase of the linearizer distortion to be opposite that of the amplifier.

7. The circuit of claim 6, wherein the amplifier is a differential amplifier.

8. The circuit of claim 6, wherein the amplifier comprises two matched amplifiers, each having one input.

9. The circuit of claim 7, further comprising a balun connected to an outputs of the differential amplifier.

10. The circuit of claim 8, further comprising a balun connected to aft outputs of the differential amplifier.

11. The circuit of claim 6, further comprising a VBIAS voltage connected to the linearizing diode network.

12. A circuit comprising:
a Modified Darlington amplifier having two inputs with drains of input stage transistors connected together;
a pre-distortion linearizer circuit connected across the two inputs of the Modified Darlington amplifier circuit and having:
an input transformer; and
a linearizing diode network connected across an output of the input transformer and including at least two diodes,
wherein the input transformer is configured to be biased with a VBIAS voltage to push current through the linearizing diode network.

13. A circuit comprising:
a cascode amplifier circuit having two inputs; and
a pre-distortion linearizer circuit connected across the two inputs of the amplifier circuit and having:
an input transformer; and
a linearizing diode network connected across an output of the input transformer and including at least two diodes.

14. A circuit comprising:
an input transformer having a first output and a second output and configured to receive a VBIAS voltage;
a first RC network connected to the first output of the input transformer;
a first linearizing diode network connected to the first RC network;
a second RC network connected to the second output of the input transformer;
a second linearizing diode network connected to the second RC network; and
an amplifier having a first input connected to the first output of the input transformer, and a second input connected to the second output of the input transformer.

15. The circuit of claim 14, wherein the amplifier comprises a differential amplifier.

16. The circuit of claim 14, wherein the amplifier comprises two matched amplifiers, each having one input.

17. The circuit of claim 14, wherein the first linearizing diode network comprises three diodes, and the second linearizing diode network comprises three diodes.

18. A circuit comprising:
an input transformer having a first output and a second output;
a first RC network connected to the first output of the input transformer;
a first linearizing diode network connected to the first RC network;
a second RC network connected to the second output of the input transformer;
a second linearizing diode network connected to the second RC network;

a first current source connected to the first output of the input transformer;

a second current source connected to the second output of the input transformer; and an amplifier having a first input connected to the first output of the input transformer, and a second input connected to the second output of the input transformer.

19. The circuit of claim 18, wherein the amplifier comprises a differential amplifier.

20. The circuit of claim 18, wherein the amplifier comprises two matched amplifiers, each having one input.

21. The circuit of claim 18, wherein the first linearizing diode network comprises three diodes, and the second linearizing diode network comprises three diodes.

22. A circuit comprising:
   an input transformer having a first output and a second output;
   a first RC network connected to the first output of the input transformer;
   a first linearizing diode network connected to the first RC network;
   a second RC network connected to the second output of the input transformer;
   a second linearizing diode network connected to the second RC network;
   a VBIAS voltage connected to the first and second linearizing diode networks; and
   a Modified Darlington amplifier having a first input connected to the first output of the input transformer, and a second input connected to the second output of the input transformer, wherein drains of input stage transistors in the amplifier are connected together.

23. A circuit comprising:
   an input transformer having a first output and a second output;
   a first RC network connected to the first output of the input transformer;
   a first linearizing diode network connected to the first RC network;
   a second RC network connected to the second output of the input transformer;
   a second linearizing diode network connected to the second RC network;
   a voltage connected to the first and second linearizing diode networks;
   a first current source connected to the first output of the input transformer;
   a second current source connected to the second output of the input transformer; and
   a differential cascode amplifier connected to the first and second outputs of the input transformer.

\* \* \* \* \*